United States Patent [19]

Shao et al.

[11] Patent Number: 6,042,990
[45] Date of Patent: Mar. 28, 2000

[54] THERMOSETTING POLYESTER ANTI-REFLECTIVE COATINGS FOR MULTILAYER PHOTORESIST PROCESSES

[75] Inventors: Xie Shao; Colin Hester, both of Rolla; Tony D. Flaim, St. James; Terry Lowell Brewer, Rolla, all of Mo.

[73] Assignee: Brewer Science, Inc., Rolla, Mo.

[21] Appl. No.: 09/328,316

[22] Filed: Jun. 8, 1999

Related U.S. Application Data

[62] Division of application No. 08/954,425, Oct. 20, 1997, Pat. No. 5,935,760.

[51] Int. Cl.[7] .................................................. G03C 1/492
[52] U.S. Cl. ...................... 430/271.1; 430/512; 430/908
[58] Field of Search ................................ 430/271.1, 512, 430/908

[56] References Cited

U.S. PATENT DOCUMENTS 5,234,990  8/1993  Flaim et al. ............................. 524/609
5,736,301  4/1998  Fahey et al. ............................. 430/325

*Primary Examiner*—Edward J. Cain
*Attorney, Agent, or Firm*—Veo Peoples, Jr.; Holly M. Amjad

[57] ABSTRACT

Thermosetting, bottom-applied polymeric anti-reflective coatings exhibiting high optical density, rapid plasma etch rates, high solubility in preferred coating solvents, excellent feature coverage, and improved stability in solution are disclosed. The principal component of these new anti-reflective coatings is a polyester resin produced by the reaction of one or more difunctional aliphatic carboxylic acids with a stoichiometric excess of a di- and/or a trifunctional aliphatic primary alcohol, wherein at least one of the dicarboxylic acids may contain a reactive methylene ($—CH_2—$) group. The resulting polyester resin reaction product is further modified by attaching light-absorbing groups to some or all of the reactive methylene groups (if present) and/or hydroxy groups present on the resin. The dye-attached polyester resin is combined with an aminoplast crosslinking agent and acid catalyst in a suitable solvent system to form the final anti-reflective coating.

3 Claims, 4 Drawing Sheets

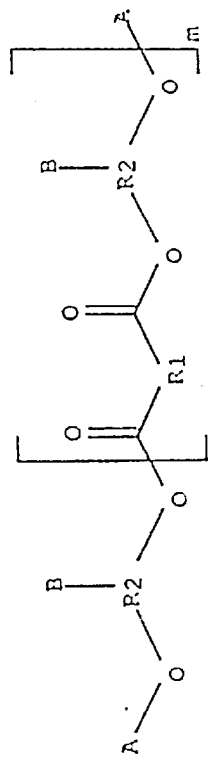

Figure 1. The general structure of the dye-attached polyester resin component in the anti-reflective coating compositions.

where $1 \leq m \leq 100$;

where R1 is a divalent organic radical;

where R2 is a divalent or trivalent organic radical;

where when R2 is divalent, B = -H, and when R2 is trivalent, B is -OH or -O-A; and where A is -H or -CO-R3 and R3 is an aromatic organic radical which provides optical absorptivity at or near one or more of the following wavelengths of light: 193 nm, 248 nm, 365 nm, and 436 nm.

Figure 2. Suitable R1 radical structures for the dye-attached polyester resin component of the anti-reflective coating compositions.

| Substituent Type | Example Structure |
|---|---|
| alkyl | $-(CH_2)_n-$ where $n = 0 - 4$ |
| cyclcalkyl | 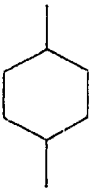 |
| heteroalkyl | $-CH_2-CH_2-O-CH_2-CH_2-$ |
| alkenyl |  |
| aryl |  |
| heterocyclic | 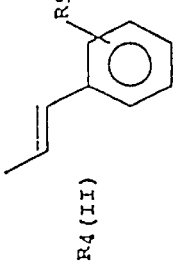 |
| polycyclic |  | where R4 is an aromatic substituent such as one of the following structures:

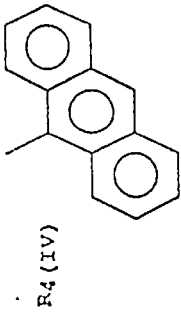

R4(I)  R4(II)

R4(III)  R4(IV)

where R5 and R6 are independently $-H$, $-OH$, $-OCH_3$, $-NO_2$, $-Cl$, $-F$, $-Br$, $-N(CH_3)_2$, or $-N(CH_2CH_3)_2$ Figure 3. Suitable R2 radical structures for the dye-attached polyester resin component of the anti-reflective coating compositions.

| Substituent Type | Example Structure | Substituent Type | Example Structure |
|---|---|---|---|
| alkyl | $-(CH_2)_n-$ where n = 0 – 6 | heteroalkyl | $-CH_2(OCH_2CH_2)_yO-$ |
| | $H_3C-CH_2-\underset{\mid}{\overset{CH_2-}{\underset{CH_2-}{C}}}-CH_2-$  R2(I) | | $H_3C-CH_2-\underset{\mid}{\overset{CH_2(OCH_2CH_2)_yO-}{\underset{CH_2(OCH_2CH_2)_yO-}{C}}}-CH_2(OCH_2CH_2)_yO-$ |
| | $H_3C-\underset{\mid}{\overset{CH_2-}{\underset{CH_2-}{C}}}-CH_2-$  R2(II) | | $H_3C-CH_2-\underset{\mid}{\overset{CH_2(OC_3H_6)_yO-}{\underset{CH_2(OC_3H_6)_yO-}{C}}}-CH_2(OC_3H_6)_yO-$ |
| cycloalkyl | (1,4-diethylcyclohexyl structure) (1,3-diethylcyclohexyl structure) | | $H_3C-\underset{\mid}{\overset{CH_2(OCH_2CH_2)_yO-}{\underset{CH_2(OCH_2CH_2)_yO-}{C}}}-CH_2(OCH_2CH_2)_yO-$ |
| | | | $H_3C-\underset{\mid}{\overset{CH_2(OC_3H_6)_yO-}{\underset{CH_2(OC_3H_6)_yO-}{C}}}-CH_2(OC_3H_6)_yO-$ |
| alkylaryl | (1,4-diethylphenyl structure) (1,3-diethylphenyl structure) | | $-CH_2-CH_2-O-CH_2-CH_2-$ |
| | | | $-(OCH_2CH_2)_xO-$ |
| | | | $-(OCH(CH_3)CH_2)_xO-$ |

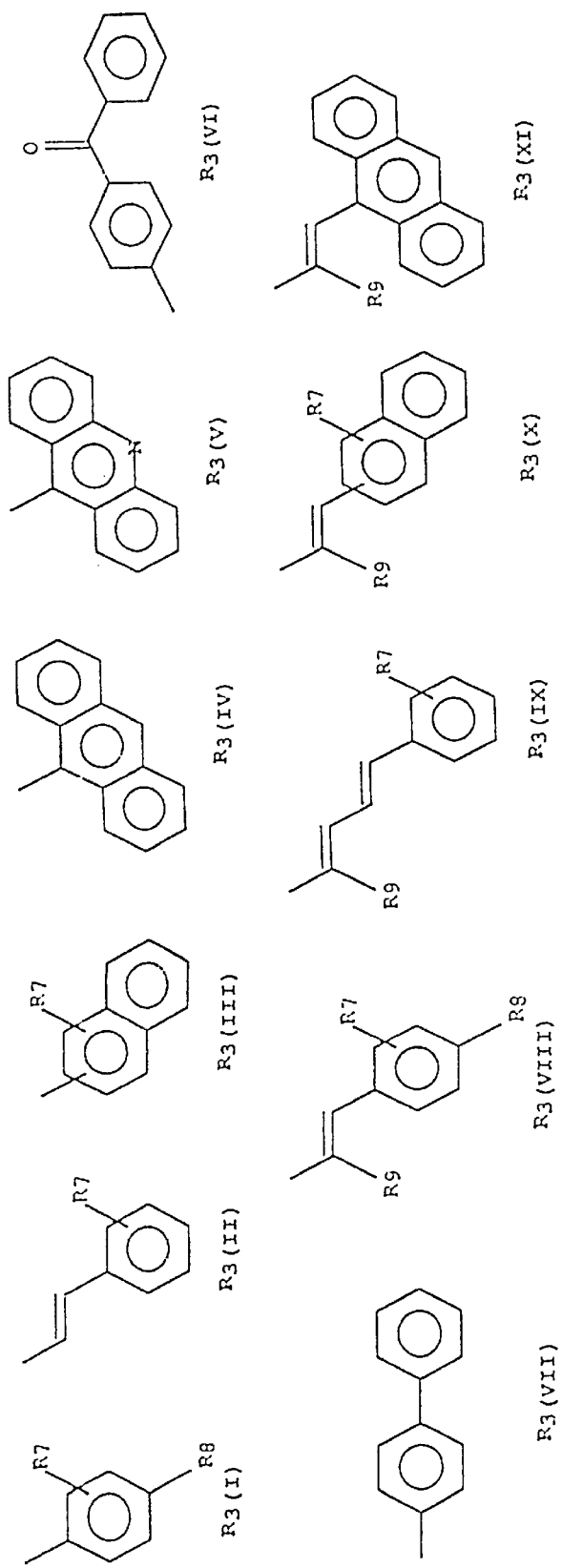
Figure 4. Suitable R3 substituents for the dye-attached polyester resin component of the anti-reflective coating compositions.
where R7 and R8 are independently –H, –OH, –OCH3, –NO2, –Cl, –F, –Br, –N(CH3)2, or –N(CH2CH3)2; –CO–OR10, –CO–N(R10)2, –CO–R10, –CN; and
where R9 is –H, –CH3, or –CH2CH3.
where R10 is –H, –CH3, or –CH2CH3.

THERMOSETTING POLYESTER ANTI-REFLECTIVE COATINGS FOR MULTILAYER PHOTORESIST PROCESSES

This application is a division of application Ser. No. 08/954,425 filed Oct. 20, 1997 now U.S. Pat. No. 5,935,760.

BACKGROUND OF THE INVENTION

1. Field of the Invention

The present invention relates to bottom-layer, thermosetting polymeric anti-reflective coatings used in multilayer photoresist systems, particularly to those having improvements in plasma etch rate, optical density, solubility in preferred coating solvents, feature coverage, and storage stability.

2. Background of the Prior Art

The effectiveness of bottom-layer polymeric anti-reflective coatings for achieving good critical dimension (CD) control in microlithographic processes is well established (U.S. Pat. No. 4,910,122). As device feature sizes have now decreased to the sub-0.5 micron regime, it has become imperative to use such anti-reflective coatings to inhibit standing wave formation within photoresist layers, eliminate backscattered light from microelectronic substrates, and reduce swing curve amplitude.

Current bottom-layer polymeric anti-reflective coating technologies have severe limitations for producing sub-0.5 micron feature sizes. Most notably, the intermixing between thermoplastic anti-reflective coatings (U.S. Pat. Nos. 5,234,990, 5,294,680, and 5,532,332, incorporated herein by reference) and overlying photoresist layers gives rise to discernible distortions at the base of the patterned features when viewed in cross-section. The magnitude of these distortions has now become significant because of the extremely small feature size, making any such distortion in the line shape unacceptable in device fabrication.

Thermosetting anti-reflective coatings exhibiting higher resistance to intermixing with photoresist layers have been introduced recently to overcome the limitations of thermoplastic anti-reflective coatings. Our co-pending U.S. patent application Ser. No. 08/517,089, entitled *Thermosetting Anti-Reflective Coatings and Method,* herein incorporated by reference, describes thermosetting anti-reflective coatings comprised principally of an oligomeric, hydroxy-functional resin; an aminoplast cross-linking agent; a protonic acid catalyst; and an appropriate solvent vehicle; wherein the hydroxy-functional resin is the reaction product of a phenolic or carboxylic acid dye with a low molecular weight epoxy resin having an epoxy functionality of 3 to 10. The coatings are cured by baking for 30 to 120 seconds at temperatures above 150° C.

The curing mechanism of the thermosetting anti-reflective coatings disclosed in co-pending U.S. patent application Ser. No. 08/517,089 has a crosslinking mechanism similar to that of aminoplast-containing industrial coatings and photoresists such as those described in U.S. Pat. Nos. 3,744,904, 4,149,888, 4,316,940, 4,341,859, 4,478,932, 4,518,676, 4,734,444, 5,034,304, and 5,376,504, and herein incorporated by reference. It should be noted, however, that none of these prior art industrial coating nor photoresist compositions fulfills the requirements for anti-reflective coating applications, particularly with regard to providing sufficient light attenuation at typical anti-reflective coating thicknesses of 0.05–0.20 microns.

Although the dye-attached thermosetting anti-reflective coatings derived from low molecular weight epoxy resins provide many unexpected benefits, there are drawbacks. One such draw-back is their tendency to dewet on silicon dioxide, silicon nitride, and ion implanted microelectronic substrates, though this problem can often be corrected by appropriate formulation changes. A more serious drawback occurs upon plasma etching images into the anti-reflective coating layer. For example, for one preferred deep ultraviolet embodiment of our co-pending application, oxygen plasma etching proceeds at rates no faster than 1.25 times a thermoplastic polyarylethersulfone anti-reflective coating described in U.S. Pat. No. 5,234,990. Since polyarylethersulfone anti-reflective coatings are known generally to etch more slowly than deep ultraviolet photoresists, this implies that the thermosetting anti-reflective coating described in the co-pending application will etch at approximately the same rate as the photoresist during the pattern transfer step. Since the anti-reflective coating layer thickness is typically 0.05–0.10 microns, a significant negative etch bias may be observed at resist feature sizes below 0.30 microns unless the plasma etch process is highly anisotropic.

Fast-etching, thermosetting anti-reflective coatings derived from high molecular weight acrylic polymers have been disclosed. For example, European Patent Application No. 92118070.9 describes anti-reflective coating compositions which contain a dye-attached acrylic copolymer and an aminoplast crosslinking agent. However, the optical density, or light absorbing power, of such systems is limited by polymer insolubility at high levels of dye attachment. This is a critical limitation for mid-ultraviolet anti-reflective coatings since the known dye structures for this wavelength range have modest absorbance and must be present in high concentration to achieve an effective film optical density.

European Patent Application No. 93305124.3 likewise discloses thermosetting anti-reflective coatings which comprise at least one compound (typically, a polymer or an oligomer) having one or more glycidyl functions, at least one phenolic anthracene dye, and a solvent capable of dissolving these compounds. However, unlike the aminoplast-containing anti-reflective coating compositions discussed above, the title compositions must be heated for several minutes at high temperatures to insolubilize the coating. This long cure cycle reduces wafer throughput and makes the process generally unacceptable to manufacturers. In addition, the preparation of the title anti-reflective coatings, particularly that of the phenolic anthracene dye components, involves many steps, making the coatings too expensive to produce and use on a practical basis.

U.S. Pat. No. 5,597,868 discloses similar thermosetting anti-reflective coatings for 193 nm photolithography. A polyphenolic dye such as a novolac resin is combined with an acrylic polymer which has pendant epoxide functionality. Heating the coating results in a thermosetting reaction between the phenolic hydroxyl groups of the dye and the epoxide groups of the polymer. As claimed therein, however, the curing process must proceed for more than 10 minutes at temperatures greater than 170° C. to be effective.

SUMMARY OF THE INVENTION

It is therefore a principal object of the present invention to provide a novel thermosetting anti-reflective coating composition and method of using the same which negates the drawbacks of the prior art.

It is particular object of this invention to improve the plasma etch rate relative to dye-attached thermosetting anti-reflective coatings derived from low molecular weight epoxy resins while retaining the following desirable properties:

fast curing speed;

adequate solubility in preferred coating solvents even at high levels of dye attachment;

long storage life at room temperature;

high resistance to intermixing with photoresists;

high optical density at any desired major exposing wavelength of interest through easy chemical modification; and reasonable cost.

It is also a particular object of the present invention to achieve superior wetting and feature coverage in comparison to dye-attached thermosetting anti-reflective coatings derived from low molecular weight epoxy resins.

The improved thermosetting anti-reflective coating composition is comprised principally of 1) a dye-attached, aliphatic polyester resin having suitable functionality for reaction with aminoplast crosslinking agents; 2) a multifunctional aminoplast (or reactively equivalent) crosslinking agent, and 3) a protonic acid catalyst, all of which are dissolved in a suitable solvent vehicle. The composition is applied onto a semiconductor substrate and then heated typically for 60 seconds to form a cross-linked coating which exhibits high optical density at mid- and/or deep ultraviolet exposing wavelengths, long storage life at room temperature, excellent feature coverage, and fast plasma etching characteristics. The improved etch rate and feature coverage properties derive from the high aliphatic content and high oxygen content of the dye-attached polyester resin component which constitutes the bulk of the anti-reflective coating.

DESCRIPTION OF THE DRAWINGS

FIG. 1. The general structure of the dye-attached polyester resin component of the anti-reflective coating compositions.

FIG. 2. Suitable $R_1$ radical structures for the dye-attached polyester resin component of the anti-reflective coating compositions.

FIG. 3. Suitable $R_2$ radical structures for the dye-attached polyester resin component of the anti-reflective coating compositions.

FIG. 4. Suitable $R_3$ substituents for the dye-attached polyester resin component of the anti-reflective coating compositions.

DETAILED DESCRIPTION AND PREFERRED EMBODIMENTS

The thermosetting anti-reflective coating compositions of the present invention preferably comprise:

a) a polyester resin containing integral reactive hydroxy groups, which resin is produced by the reaction of one or more difunctional aliphatic carboxylic acids with a stoichiometric excess of a di- and/or a trifunctional aliphatic primary alcohol, wherein at least one of the dicarboxylic acids preferably contains a reactive methylene (—$CH_2$—) group, and wherein the resulting polyester reaction product is further modified by attaching light-absorbing groups to some or all of the reactive methylene groups and/or the hydroxy groups which are integral to the polyester structure;

b) an alkylated aminoplast crosslinking agent derived from melamine, urea, benzoguanamine, or glycoluril;

c) a protonic acid catalyst (for curing);

d) a low-to-medium boiling (70°–180° C.) alcohol-containing solvent system comprising at least 20% by weight alcohol.

Components of Composition

1. Polyester Resins and Dye Graft Substituents

The general structure of the dye-attached polyester resin component in the new anti-reflective coating compositions is depicted in FIG. 1. The dicarboxylic acid constituent [HOOC—$R_1$—COOH] of the polyester resin may be alkyl, cycloalkyl, heteroalkyl, alkenyl, aryl, heterocyclic, or polycyclic in nature, though dicarboxylic acids having some aliphatic content are preferred for imparting fast plasma etch rates to the anti-reflective coating. Examples of suitable $R_1$ radical structures are shown in FIG. 2. Of the structures shown there, alkyl radicals wherein n=0–2 (corresponding to oxalic acid, malonic acid, and succinic acid, respectively) and isobutenyl radicals having pendant aromatic substituents ($R_4$) which confer absorptivity at the principal ultraviolet exposing wavelengths are preferred. The substituted isobutenyl radical structures are highly preferred for obtaining anti-reflective coatings with high optical density. As is well known in the art, dicarboxylic acids having an $R_8$-substituted isobutenyl radical structure are the reaction products of malonic acid with aromatic aldehydes.

For 193 nm and 365 nm exposing wavelength applications, $R_4$ substituents such as $R_{4(I)}$ and $R_{4(II)}$ are preferred. The $R_{4(I)}$ structures wherein $R_5$ is hydrogen or m-methoxy and $R_6$ is hydroxy are especially preferred. For 248 nm exposing wavelength applications, $R_4$ substituents such as $R_{4(III)}$ and $R_{4(IV)}$ are preferred. Of these, $R_{4(IV)}$ is especially preferred.

The difunctional [HO—$R_2$—OH] and/or trifunctional [HO—$R_2$(—OH)$_2$] primary alcohol constituents of the polyester may be alkyl, cycloalkyl, alkylaryl, or heteroalkyl in nature. Examples of suitable $R_2$ radical structures are shown in FIG. 3. Of these, $R_{2(I)}$ and $R_{2(II)}$ (corresponding to trimethylol propane and trimethylol ethane, respectively) are preferred for preparing polyesters with rapid plasma etch rates and multiple hydroxy functionality for attaching light-absorbing groups.

Light absorbency is provided by the $R_4$-substituted isobutenyl radical structures (if present) contained in the main chain of the polyester resin and by the $R_3$ substituents attached via ester linkages [—O—CO—$R_3$] at some or all of the hydroxy sites present on the resin. The $R_3$ substituents are preferably monovalent, substituted or unsubstituted phenyl, cinnamyl, (vinyl) naphthyl, (vinyl) anthracenyl, acridinyl, biphenyl, benzo-phenone, or 5-phenylpentadienyl radicals; suitable structures are shown in FIG. 4. It is to be understood that any such aromatic substituents which provide high light absorbency at or near one of the principal exposing wavelengths of interest may be used equivalently to create useful dye-attached polyester components. For 193 nm exposing wavelength applications, $R_3$ substituents such as $R_{3(I)}$ are preferred. For 365 nm exposing wavelength applications, $R_3$ substituents such as $R_{3(VIII)}$ and $R_{3(IX)}$ are preferred. The $R_{3(VIII)}$ structures wherein $R_7$ is hydrogen or m-methoxy and $R_8$ is hydroxy, methoxy, N,N-dimethylamino, or N,N-diethylamino are especially preferred. $R_{3(VIII)}$ structures wherein $R_7$ is hydrogen or m-methoxy and $R_8$ is hydroxy are most preferred for 365 nm applications. For 248 nm exposing wave-length applications, $R_3$ substituents such as $R_{3(IV)}$, $R_{3(VI)}$, $R_{3(VII)}$, and $R_{3(X)}$ are preferred. Structures $R_{3(IV)}$ and $R_{3(XI)}$ are especially preferred.

2. Acid Catalysts

While p-toluenesulfonic acid is a preferred acid catalyst, other strong protonic acids such as dodecylbenzenesulfonic acid, oxalic acid, phthalic acid, phosphoric acid, and mixtures thereof, may be employed suitably. Acid catalysts with formula weights greater than 80 g/mole are preferred to prevent sublimation when the anti-reflective coating is thermally cured.

3. Crosslinking Agents

The new anti-reflective coatings are cured on the semiconductor substrate by the application of heat. Heating induces a crosslinking reaction between the hydroxyl substituents on the dye-attached polyester component and the aminoplast crosslinking agent. Such curing mechanisms are well known from the prior art (see, for example, G. D. Thornley, U.S. Pat. No. 4,316,940). Suitable aminoplasts include glycoluril-formaldehyde resins, melamine-formaldehyde resins, benzoguanamine-formaldehyde resins, and urea-formaldehyde resins. The use of methylated and/or butylated forms of these resins is highly preferred for obtaining long storage life, about three to twelve months, under catalyzed conditions. Highly methylated melamine-formaldehyde resins exhibiting degrees of polymerization less than two are generally useful for preparing the title anti-reflective coatings. Monomeric, methylated glycoluril-formaldehyde resins are especially useful for preparing thermosetting polyester anti-reflective coatings which can be used in conjunction with chemically amplified, acid-catalyzed photoresists. The aminoplast resin is preferably added to the coating in a proportion which provides 0.20–2.00 equivalents of reactive alkoxymethyl crosslinking function per polymer hydroxyl function. A proportion which provides 0.50–1.50 reactive equivalents per hydroxyl is especially preferred.

4. Solvents and Additives

Suitable solvents for the new anti-reflective coatings include alcohols, esters, glymes, ethers, cyclic ketones, and their admixtures which boil in the range 70°–180° C. Especially preferred solvents and co-solvents include 1-methoxy-2-propanol (PGME), cyclohexanone, ethyl 3-ethoxypropionate, and ethyl lactate. Alcohols such as PGME and ethyl lactate should comprise at least 20 weight percent of the coating solvent system to lend long storage life.

The coatings may be amended with small amounts (up to 20 wt. % of total solvents) of conventional high boiling anti-reflective coating solvents such as γ-butyrolactone and tetra-hydrofurfuryl alcohol to improve the solubility of the dye-attached polymer component, provided the solvents do not cause coating quality or photoresist incompatibility problems. Surfactants such as 3M Company's FLUORAD® FC-171 or FC-430 and adhesion promoters such as glycidoxypropyl triethoxysilane may be added to optimize coating performance.

Method of Preparation

1. Polyester Resin Synthesis

In the first step, the basic polyester resin structure is prepared by condensing the dicarboxylic acid(s) and primary diol and/or triol components under elevated temperature, azeotropic conditions in the presence of a strong acid catalyst such as p-toluenesulfonic acid. The polymerization is preferably conducted under azeotropic conditions with solvents such as toluene or xylene to effectively remove by-product water from the reactor and thereby enhance the degree of polymerization. Such polyester polymerization processes are well known in the art. [For example, see 1) French Patent 1,256,088 (1961), 2) French Patent 1,137,056 (1957), and 3) A. Ravve, G. Pasternack, K. H. Brown, and S. B. Radlove, *Journal of Polymer Science (Polymer Chemistry Edition)*, Vol. 11, pp. 1733–1752 (1973).] Monocarboxylic acids of the form, HOOC—$R_3$, may be added to the initial polymerization mixture to directly form dye-attached polyester structures or precursors thereto. Alternatively, the monocarboxylic acids may be attached to the initially formed hydroxy-functional polyester resin in a second step using similar reaction conditions.

If the polyester has been prepared from dicarboxylic acids containing reactive methylene groups, most notably, malonic acid [HOOC—$CH_2$—COOH], these sites can be modified by reaction with aromatic aldehydes to form light-absorbing structures of the type [—CO—C(=$R_4$)—CO—]. The modification is performed under elevated temperature, azeotropic conditions in the presence of an alkaline catalyst to promote Knoevenagel condensation of the aldehyde and reactive methylene function. Piperidine, pyridine, or a mixture of the two amines are preferred catalysts. However, other organic bases, including soluble acetates, amino-acids, alkylamines can be used acceptably.

The same conditions can be applied to condense aromatic aldehydes with suitably reactive monocarboxylic acids attached to the polyester structure in previous steps. For example, pendant cyanoacetic esters can be condensed with aromatic aldehydes to form light-absorbing structures of the type $R_{3(VIII)}$, $R_{3(IX)}$, $R_{3(X)}$, and $R_{3(XI)}$, where $R_9$ is a cyano (—CN) group.

2. Anti-reflective Coating Formulation

In the second step, the solution of the dye-attached polyester resin is combined with the aminoplast, acid catalyst, and other additives such as surfactants and diluted to the desired total solids concentration. The order of addition is generally not critical to performance. A total solids level of 2.5–10.0 wt. % is typically needed in the anti-reflective coating solution for achieving the desired 350–2500 Å film thickness when the solution is spin coated at 1000–6000 rpm for 30–90 seconds and then cured by baking.

Preferred Coating Compositions

Preferred compositional ranges (expressed in wt. % based on total resin solids) for the dye-attached polyester resin, aminoplast crosslinking agent, and acid catalyst are as follows:

| COMPONENT | USEFUL RANGE | ESPECIALLY PREFERRED |
|---|---|---|
| DYE-ATTACHED POLYESTER RESIN | 50–90 | 60–85 |
| AMINOPLAST CROSSLINKING AGENT | 10–50 | 15–35 |
| ACID CATALYST | 0.1–10 | 2–5 |

When combined in these proportions, the anti-reflective coatings demonstrate excellent resist compatibility, i.e., no intermixing with photoresist, as well as good room temperature stability, and rapid curing characteristics at bake temperatures between 150°–225° C.

Method of Use

The thermosetting polyester anti-reflective coating compositions can be used effectively on a vast spectrum, if not all, semiconductor substrates including, but not limited to, crystalline and polycrystalline silicon, silicon dioxide, silicon (oxy)nitride, aluminum, aluminum/silicon alloys, and tungsten. The anti-reflective coatings are applied by spin coating at 1000–6000 rpm for 30–90 seconds. Spinning speeds of 1500–4000 rpm are especially preferred for obtaining uniform, defect-free coatings on the 6" and 8" substrates commonly used in semiconductor manufacture. The spin coated film is then cured at 120°–225° C. for 30–120 seconds on a hot plate or equivalent baking unit. Bake temperatures of 150°–200° C. and bake times of 45–90 seconds are especially effective for achieving high resistance to intermixing with the photoresist. The final film thickness is adjusted to 350–2500 Å and, more preferably, to 500–1500 Å depending upon the substrate type.

A photoresist is applied over the cured anti-reflective coating by spin coating and then soft baked, exposed, and developed to create the desired masking pattern. An optional post-exposure bake may be applied to the resist prior to development. The resist pattern is then transferred into the anti-reflective coating layer by reactive ion etching (also known as dry etching or plasma etching) using various gases or gas mixtures which are known in the microlithographic art to be effective for etching organic materials, e.g., O2, C12, $F_2$, CF4, HCF3, SF6, their admixtures with N2, Ar, and He, etc. After the anti-reflective coating layer has been etched, the semiconductor substrate can be selectively etched, implanted, or deposited on through the pattern formed in the resist and anti-reflective coating. When these steps have been completed, the resist and anti-reflective coating are removed by plasma etching and/or dissolution in liquid stripping chemicals. The stripped substrate is then ready for a new processing cycle.

The following non-limiting examples are illustrative of the invention.

Examples 1–3 illustrate that the monomer stoichiometry and reaction sequencing may be modified to manipulate the characteristics of the polyester resin.

EXAMPLE 1

A. Two-step preparation of a non-dye-attached polyester resin using a 1.00:1.33:2.00 molar ratio of malonic acid, 1,1,1-tris(hydroxymethyl)ethane and cyanoacetic acid A 250 mL round bottom flask equipped with a mechanical stirrer, nitrogen inlet, thermometer and a Dean-Stark trap topped by a water cooled condenser was charged with 14.04 g (0.135 mol) malonic acid, 21.63 g (0.180 mol) 1,1,1-tris (hydroxymethyl)ethane, a catalytic amount of para-toluenesulfonic acid (PTSA) and 100 g toluene. The mixture was brought to reflux and formed water collected. Cyanoacetic acid (22.97 g, 0.270 mol) was added with the aid of 50 g toluene. The mixture was brought to reflux and formed water was removed azeotropically. The resulting polyester resin was separated from the reaction mixture by decantation. It exhibited the following molecular weight properties: $M_W$=2400 and $M_N$=800. Heating the polyester in vacuo increased the molecular weight to $M_W$=6930/$M_N$=1330.

B. Preparation of a dye-attached polyester resin by modification of the product prepared in Step A A reaction mixture of identical composition described in Step A ($M_W$=4050) was modified by reaction with 3 equivalents of 4-hydroxy-3-methoxybenzaldehyde (vanillin) in the presence of piperidine. The resulting dye-attached resin was orange-red in color.

EXAMPLE 2

A. Two-step preparation of a non-dye-attached polyester resin using a 1:1.48:2.44 molar ratio of malonic acid, 1,1,1-tris(hydroxymethyl)ethane and cyanoacetic acid A 250 mL round bottom flask equipped with a mechanical stirrer, nitrogen inlet, thermometer and a Dean-Stark trap topped by a water cooled condenser was charged with 7.03 g (0.0676 mol) malonic acid, 12.04 g (0.100 mol) 1,1,1-tris (hydroxymethyl)ethane, a catalytic amount of pTSA and 50 g toluene. The mixture was brought to reflux and formed water was removed azeotropically. Cyanoacetic acid (14.05 g, 0.165 mol) was added with the aid of 50 g toluene. The mixture was brought to reflux and formed water was removed by azeotropic distillation. When cooled, the polyester resin separated from the reaction mixture as a viscous oil.

B. Preparation of a dye-attached polyester resin by modification of the product prepared in Step A A dye-attached polyester resin suitable for anti-reflective coating applications was prepared by condensing vanillin in the presence of piperidine with the reaction product of Step A. The resulting product was orange-red in color.

EXAMPLE 3

A. One-step preparation of a non-dye-attached polyester resin using a 1:1.48:2.46 molar ratio of malonic acid, 1,1,1-tris(hydroxymethyl)ethane and cyanoacetic acid A 250 mL round bottom flask equipped with a mechanical stirrer, nitrogen inlet, thermometer and a Dean-Stark trap topped by a water cooled condenser was charged with 7.03 g (0.0676 mol) malonic acid, 12.04 g (0.100 mol) 1,1,1-tris (hydroxymethyl)ethane, 14.08 g (0.166 mol) cyanoacetic acid, a catalytic amount of pTSA and 60 g toluene. The mixture was brought to reflux and formed water was removed azeotropically. The polyester resin was isolated from the reaction mixture as a viscous oil.

B. Preparation of a dye-attached Polyester resin by modification of the product prepared in Step A A dye-attached polyester resin suitable for anti-reflective coating applications was prepared by condensing vanillin in the presence of piperidine with the reaction product of Step A. The latter was not isolated from the initial reaction mixture before beginning the condensation reaction. The resulting product was orange-red in color.

EXAMPLE 4

A. Preparation of a linear Polyester resin using a 1:1.15 molar ratio of malonic acid and ethylene glycol A 250 mL round bottom flask equipped with a mechanical stirrer, nitrogen inlet, thermometer and a Dean-Stark trap topped by a water cooled condenser was charged with 26.0 g malonic acid, 17.81 g ethylene glycol, a catalytic amount of pTSA and 200 g toluene. The mixture was brought to reflux. Formed water was removed continuously to advance the polymerization reaction.

B. Preparation of a dye-attached polyester resin by modification of the product prepared in Step A To 7.16 g of the polyester resin prepared in Step A was added vanillin (7.61 g), toluene (60 g), and a catalytic amount of piperidine. The reaction mixture was brought to reflux and the formed water collected. The resulting dye-grafted polyester was easily separated from the toluene mixture by decantation. The product exhibited a peak ultraviolet absorbance at 335 nm.

EXAMPLE 5

A series of dye-attached polyesters were prepared using the same reaction conditions as in Example 4, except other aromatic aldehydes were partially or fully substituted for vanillin. The aldehyde(s) used in the reaction and the molar ratios of the reactants are summarized in the table below. The results indicated that a single non-dye-attached polyester structure could be easily modified to obtain resin products with different ultra-violet light-absorbing properties.

| ALDEHYDE(S) | MOTAR RATIO OF ALDEHYDES | POLYESTER ABSORPTION MAXIMUM (NM) |
|---|---|---|
| 4-HYDROXYBENZALDEHYDE | 1 | 325 |
| 4-(N,N-DIMETHYLAMINO)-BENZALDEHYDE | 1 | 380 |
| 4-(N,N-DIETHYLAMINO)-BENZALDEHYDE | 1 | 380 |
| 4-(N,N-DIMETHYLAMINO) BENZALDEHYDE/VANILLIN | 0.5/0.5 | 380/360 |
| 4-(N,N-DIMETHYLAMINO)-BENZALDEHYDE/VANILLIN | 0.68/0.32 | 385 |
| 4-(N,N-DIMETHYLAMINO)-BENZALDEHYDE/VANILLIN | 0.6/0.4 | — |
| 4-(N,N-DIETHYLAMINO)-BENZALDEHYDE/VANILLIN | 0.6/0.4 | 390 |
| 4-(N,N-DIETHYLAMINO)-BENZALDEHYDE/VANILLIN | 0.9/0.1 | 390 |

EXAMPLE 6

A series of terpolyesters were prepared from malonic acid, ethylene glycol, and trimethylolpropane using the conditions described in Example 1A to demonstrate that when using tri-functional alcohols, the proportion of the latter relative to the dicarboxylic acid must be selected correctly to avoid gelation of the polyester product. The results are summarized in the table below.

| MOLES OF REACTANT USED | | | |
|---|---|---|---|
| MALONIC ACID | ETHYLENE GLYCOL | TMOP* | PRODUCT OUTCOME |
| 1.0 | 0 | 1.48 | SOLUBLE |
| 1.0 | 0 | 1.33 | SOLUBLE |
| 1.0 | 0.5 | 0.5 | GELLED |
| 1.0 | 0.7 | 0.3 | GELLED |
| 1.0 | 0.9 | 0.1 | GELLED |
| 1.0 | 0.9 | 0.2 | SOLUBLE |
| 1.0 | 0 | 1.33 | SOLUBLE |
| 1.0 | 0 | 1.48 | SOLUBLE |

*TRIMETHYLOLPROPANE

EXAMPLE 7

A. Preparation of a non-dye-attached polyester resin from malonic acid and 1,4-cyclohexanedimethanol A 250 mL round bottom flask equipped with a mechanical stirrer, nitrogen inlet, thermometer and a Dean-Stark trap topped by a water cooled condenser was charged with 6.5 g malonic acid, 9.20 g 1,4-cyclohexanebismethanol and a catalytic amount of pTSA and 65 g toluene. The mixture was brought to reflux and by-product water was removed azeotropically to form the linear polyester resin.

B. Preparation of a dye-attached polyester resin by modification of the product prepared in Step A To 4.24 g of the polyester resin described in Step A, 3.04 g vanillin, a catalytic amount of piperidine, and 60 g toluene were added. The mixture was heated to reflux and the formed water was removed by azeotropic distillation, producing an orange-red resin product which was isolated from the reaction mixture by decantation.

EXAMPLE 8

A. Preparation of a polyester resin from oxalic acid, 1,1,1-tris(hydroxymethyl)ethane and cyanoacetic acid and subsequent reaction with vanillin A 250 mL round bottom flask equipped with a mechanical stirrer, nitrogen inlet, thermometer and a Dean-Stark trap topped by a water cooled condenser was charged with 6.00 g oxalic, 11.87 g 1,1,1-tris(hydroxymethyl)ethane and a catalytic amount of pTSA and 50 g toluene. The mixture was brought to reflux and by-product water was removed by azeotropic distillation to complete the polymerization. Cyanoacetic acid (13.87 g) and 40 g toluene were added to the formed resin and the mixture re-heated to reflux with formed water being removed azeotropically. Vanillin (24.82 g) and a catalytic amount of piperidine were then added directly with the aid of 40 ml toluene. The reaction mixture was brought to reflux again and additional by-product water was removed. The resulting dye-grafted polyester ($M_W$=6800, $M_N$=930) was easily separated form the toluene by decantation. The resin was then dissolved in 1-methoxy-2-propanol for formulation.

B. Anti-reflective coating formulation

An anti-reflective coating composition was prepared by combining 10.00 g of the above dye-attached polyester resin solution, 0.97 g CYMEL® 303(LF) methylated melamine-formaldehyde resin (Cytec Industries) and 0.0983 g para-toluenesulfonic acid monohydrate and diluting the mixture with 39.22 g 1-methoxy-2-propanol and 4.72 g ethyl lactate.

C. Anti-reflective coating properties

The anti-reflective coating was spin coated at 3500 rpm for 60 seconds onto 3" glass rounds and 3" silicon wafers for property evaluations. The specimens were baked for 60 seconds at 175° C. The film had an optical density of 6.1 per micron at 365 nm. An interlayer test (see below) performed with a common photoresist solvent, propylene glycol monomethyl ether acetate, gave a negligible interlayer value of 36 Å. Both results indicated that the composition was highly suitable for 365 nm exposing wavelength applications.

Description of the Stripping Test

The film thickness and optical absorbance of the anti-reflective layer are determined using coated silicon and glass substrates, respectively. The specimens are then flooded with photoresist solvent for five (5) seconds followed by spin drying at 5000 rpm for 30 seconds and baking on a hot plate at 100° C. for 60 seconds. The film thickness and optical absorbance are then re-determined. If more than a few percent decrease (>5%) in film thickness or optical absorbance results from solvent stripping, the anti-reflective coating is normally judged to have insufficient solvent resistance for practical usage.

Description of Interlayer Test

For anti-reflective coating compositions intended for 365 nm exposing wavelength (I-line) applications, the interlayer test is generally conducted as follows. After coating and baking, the anti-reflective thickness is determined by ellipsometry. Next, a one-micron thick layer of high resolution I-line photoresist is spin coated over the anti-reflective coating. The photoresist is then soft baked on a hot plate at 100° C., flood exposed on a contact printer to ensure over-exposure, and then post-exposure baked on a hot plate for 60 seconds at 120° C. The specimen is then developed in aqueous tetramethylammonium hydroxide developer for 60 seconds to clear the exposed photoresist. After drying the specimen with nitrogen, the thickness is re-determined. If significant mixing of the resist and the anti-reflective coating has occurred, the latter layer will show an apparent increase in thickness, which is normally expressed as a percentage of the starting anti-reflective coating thickness. Bottom-applied, polymeric anti-reflective coatings which are highly subject to intermixing will show more than a 10% increase in thickness after resist processing. An interlayer value of less than 5% is considered acceptable (assuming a starting layer thickness of 1000–2000 Å); a value of less than 3% is considered excellent.

EXAMPLE 9

A. Preparation of a polyester resin from dl-malic acid, 1,1,1-tris(hydroxymethyl)ethane and cyanoacetic acid and subsequent reaction with vanillin A 250 mL round bottom flask equipped with a mechanical stirrer, nitrogen inlet, thermometer and a Dean-Stark trap topped by a water cooled condenser was charged with 6.00 g dl-malic acid, 7.97 g 1,1,1-tris(hydroxymethyl)ethane and a catalytic amount of pTSA and 50 g toluene. The mixture was brought to reflux and by-product water was removed azeotropically. Cyanoacetic acid (9.33 g) and 40 g toluene were added to the formed resin and the mixture re-heated to reflux with more water being removed. Vanillin (16.68 g) and a catalytic amount of piperidine were then added directly with the aid of 40 ml toluene. The reaction mixture was brought to reflux again and the formed water was collected. After cooling, the dye-grafted polyester separated from the reaction mixture and was removed by decantation. It was then dissolved in 300 g PGME for formulation.

B. Anti-reflective coating formulation

An anti-reflective coating composition was prepared by combining 9.99 g of the above dye-attached polyester solution, 0.20 g CYMEL 303(LF) resin and 0.0163 g para-toluenesulfonic acid monohydrate and diluting the mixture with 8.10 g 1-methoxy-2-propanol and 2.9 g ethyl lactate.

C. Anti-reflective coating properties

The anti-reflective coating was spin coated at 3500 rpm for 60 seconds onto 3" glass rounds and 3" silicon wafers for property evaluations. The specimens were baked for 60 seconds at 175° C. The resulting film had an optical density of 5.4 (@365 nm) per micron film thickness; the interlayer value was 23 Å.

EXAMPLE 10

A. Synthesis of a dye-attached polyester from malonic acid, trimethylolethane, cyanoacetic acid and vanillin Into a three liter, 4-necked round bottom flask equipped with a mechanic stirrer, a nitrogen inlet, thermometer and a Dean-Stark trap topped by a water cooled condenser was charged 70.2 g (0.67 mol) malonic acid, 120.2 g (1.00 mol) of 1,1,1-tris(hydroxymethyl)ethane, 140.5 g (1.65 mol) of cyanoacetic acid, a catalytic amount of para-toluenesulfonic acid (3.0 g, 0.016 mol) and 300 g of toluene. The mixture was heated at reflux for four hours with by-product water being removed azeotropically. The contents were then cooled to room temperature. About 50 ml of water had been collected by this time. The solution was slowly re-heated. Vanillin (353.8 g, 2.33 mol) and toluene (300 g) were added to the mixture when it reached 40°–45° C.; piperidine (20 g, 0.23 mol) was added when the contents reached 55° C. The mixture was then refluxed for two hours. A total of about 90 ml of water was collected after this period. (The theoretical amount of by-product water from the two condensation steps was 96 ml.) The hot toluene was decanted from the dye-attached resin which separated from the reaction mixture. A vacuum pump with a cooling trap was connected to the reaction flask to remove residual toluene. The orange resin mass was then dissolved in 1.2 l of N-methylpyrrolidone by stirring.

B. Purification of the dye-attached polyester resin produced in Step A

The orange resin mass was dissolved in 1.2 liters of N-methylpyrrolidone by stirring. The solution was then dripped slowly into four gallons of stirring deionized water which had been acidified with 150 ml of 1.5N HCl. The precipitated polymer suspension was stirred overnight and then collected by vacuum filtration. It was then re-dissolved in 1.2 liters of NMP and re-precipitated into acidified stirring water to further remove impurities. The precipitated polymer suspension was stirred overnight and then allowed to settle for about one hour. The upper liquid layer was poured off. Two gallons of fresh de-ionized water were added to the yellow solid and stirred for 20 minutes. The washed precipitate was then collected by filtration, rinsed with one gallon of deionized water and dried under vacuum at about 40° C. for 48 hours to give 384 g (64.88%) of polymer product as yellow solid. Molecular weight analysis gave a $M_W$ value of 3500 for the dye-attached resin.

C. Anti-reflective coating formulation

An anti-reflective coating composition was prepared by mixing 4.92 parts (by weight) of the above polymer solids with 0.98 parts of CYMEL 303LF, 0.10 parts of pTSA.$H_2O$, 9.40 parts of ethyl lactate, 84.60 parts of 1-methoxy-2-propanol and a small portion of fluorinated surfactant. The mixture was stirred for about one hour to give a clear solution and filtered to 0.1 micron (absolute) using endpoint filters.

D. Anti-reflective coating properties

The above formulation was spin coated onto a silicon wafer and baked at 175° C. for 60 sec. The film thickness of the resulting anti-reflective coating was 1350 Å. It exhibited an optical density of about 6.2 per micron @365 nm. A stripping test performed with ethyl lactate and an interlayer test gave values of 6 Å and 9 Å, respectively.

E. Anti-reflective coating lithographic performance

A positive-tone photoresist was applied over the anti-reflective film by spin coating and baked at 90° C. for 60 seconds to form a layer with a film thickness of about 0.9 $\mu$m. The coated wafer was patternwise exposed to a light source having a wavelength of about 365 nm and then baked at 110° C. for 60 seconds. After development with tetramethylammonium hydroxide solution for 60 seconds, the patterned wafer was examined by scanning electron microscopy to reveal photoresist relief structures with undistorted, vertical side walls at feature sizes as small as 0.35 micron. The excellent quality of the photoresist features indicated that no intermixing occurred between the photoresist and the anti-reflective coating.

F. Anti-reflective coating coverage properties

Production-quality, phosphorus-doped polysilicon wafers having relief structures 0.4–0.6 micron in width and 0.7 micron in height were coated with the anti-reflective coating composition. Microscopic examination revealed that the anti-reflective film was continuous over the relief structures and showed no evidence of dewetting or void formation, particularly at the edges of the structures. A test performed with a preferred composition described in co-pending U.S. patent application Ser. No. 08/517,089, on the other hand, showed severe dewetting on the same substrates.

G. Anti-reflective coating plasma etch rates

The plasma etch rate of the new anti-reflective coating composition was compared to that of a polyarylethersulfone anti-reflective coating (Brewer Science ARC®-CD 11) described in U.S. Pat. No. 5,234,990. The relative plasma etch rate results are listed below for different etching gas mixtures.

| GAS MIXTURE | RELATIVE PLASMA ETCH RATE vs. ARC-CD 11* |
|---|---|
| AR/CF$_4$/HCF$_3$ | 2.30–3.12 |
| CF$_4$/HE/O$_2$ | 1.61–1.72 |
| AR/CF$_4$/HCF$_3$/HE | 1.65–2.44 |
| AR/CF$_4$ | 1.51–1.55 |

*THE RELATIVE PLASMA ETCH RATE OF CD 11 WAS DEFINED AS 1.00

EXAMPLE 11

A. Synthesis of a dye-attached polyester resin from malonic acid, trimethylolethane, cyanoacetic acid, and a mixture of anthraldehyde and vanillin In a 250 ml, three-necked round bottom flask, equipped with a mechanic stirrer, a nitrogen inlet, thermometer and a Dean-Stark trap topped by a water cooled condenser was charged with 7.02 g malonic acid, 12.02 g 1,1,1-tris (hydroxymethyl)ethane, 14.05 g cyanoacetic acid, a catalytic amount of para-toluene-sulfonic acid (0.30 g) and 50 g of toluene. The mixture was heated at refluxed for four hours and then cooled to room temperature. About 4.4 ml of water had been removed azeotropically by this time. 9-Anthraldehyde (9.58 g), a catalytic amount of piperidine and additional 50 g of toluene were added to the mixture which was then refluxed for 30 minutes. Next, vanillin (28.30 g) was added to the mixture and refluxing was applied for another two hours. A total of about 8.6 ml of water were collected during this sequence of condensations. The hot toluene was decanted from the reaction mixture, leaving a sticky polymer mass. A vacuum pump with cooling trap was connected to the reaction flask to remove the remaining toluene. The resin mass solidified into an orange-yellow solid upon cooling. Molecular weight analysis gave a $M_W$ value of 2985 for the dye-attached polyester resin product.

B. Anti-reflective coating formulation

An anti-reflective formulation was prepared by combining 4.92 parts of the above polymer solid with 0.98 parts of POWDER-LINKS 1174 methylated glycoluril-formaldehyde resin (Cytec Industries), 0.10 parts of pTSA.E$_2$O, 9.40 parts of ethyl lactate, 84.60 parts of 1-methoxy-2-propanol and a small portion of fluorinated surfactant. The mixture was stirred for about one hour to give a clear solution and filtered through endpoint filters to 0.2 microns (absolute).

C. Anti-reflective coating Properties

The above formulation was spin coated onto a silicon wafer and baked at 175° C. for one minute. The resulting anti-reflective coating had a layer thickness of 1160 Å and exhibited an optical density of 6.5/μm at 193 nm, 6.0/μm at 248 nm and 4.7/μm at 365 nm exposing wavelengths.

D. Anti-reflective coating lithographic performance

A positive-tone photoresist was applied by spin coating over the anti-reflective film and baked at 90° C. for 60 seconds to obtain a photoresist layer with a film thickness of about 0.9 μm. The coated wafer was patternwise exposed to a light source having a wavelength of about 365 nm and then baked at 110° C. for 60 seconds. After development in aqueous tetramethylammonium hydroxide solution for 60 seconds, the patterned wafer was examined by scanning electron microscopy to reveal 0.35 micron wide photoresist relief structures with undistorted, vertical side walls which were absent of any footing caused by intermixing between the photoresist and anti-reflective coating layers.

A positive-working, chemically-amplified deep ultraviolet photoresist was applied by spin coating over the anti-reflective coating and baked at 90° C. for 90 seconds to achieve a photo-resist layer thickness of about 0.7 μm. The coated wafer was patternwise exposed to a light source having a wavelength of about 248 nm and then baked at 110° C. for 90 seconds. After development, the patterned wafer was examined by scanning electron microscopy to reveal photoresist relief structures with undistorted, vertical side walls at a nominal feature size of 0.35 micron.

What is claimed is:

1. A method for making a thermosetting anti-reflective coating composition exhibiting an etch selectivity to novolac- and poly(hydroxystyrene)-based photoresists greater than 1.0 under oxygen plasma etch conditions, said method comprising:

a. forming a light-absorbing, hydroxyl-functional, highly aliphatic polyester resin by condensation methods; and b. purifying said polyester resin by removal of residual solvents, starting materials, by-products, and impurities from the resin by applying heat and/or vacuum; and/or by dissolving said polyester resin in a water-soluble solvent and precipitating the mixture into a large volume of acidified water, after which the precipitated resin is collected and dried; and c. combining said polyester resin with an alkylated aminoplast crosslinking agent and a protonic acid curing catalyst in a low-to-medium boiling solvent system wherein alcohol comprises at least 20 weight percent of the solvent system; and the overall formulation having a total solids content of about 3 to about 10 weight percent;

whereby the anti-reflective coating composition so formed can be applied by spin coating onto semiconductor substrates and then baked at temperatures in the range 120° C.–225° C. to obtain a uniform, crosslinked film which exhibits high optical density at a target exposing wavelength and shows no intermixing with a subsequently applied photoresist.

2. The method of claim 1 wherein the solids composition comprises about 50% to 90% hydroxyl-functional polyester resin; about 10% to 50% aminoplast crosslinking agent, and about 0.1% to 10% protonic acid catalyst by weight of solids content.

3. The method of claim 1 wherein the solids composition comprises about 60% to 85% hydroxyl-functional polyester resin, about 15% to 35% aminoplast crosslinking agent, and about 2% to 5% protonic acid catalyst by weight of solids content.

* * * * *